(12) United States Patent
Zhang et al.

(10) Patent No.: US 7,253,693 B2
(45) Date of Patent: Aug. 7, 2007

(54) METHOD AND APPARATUS FOR NOISE COMPENSATION IN AN OSCILLATOR CIRCUIT

(75) Inventors: Ligang Zhang, Austin, TX (US); Yunteng Huang, Irvine, CA (US)

(73) Assignee: Silicon Laboratories Inc., Austin, TX (US)

( * ) Notice: Subject to any disclaimer, the term of this patent is extended or adjusted under 35 U.S.C. 154(b) by 68 days.

(21) Appl. No.: 11/004,022

(22) Filed: Dec. 3, 2004

(65) Prior Publication Data

US 2005/0285687 A1    Dec. 29, 2005

Related U.S. Application Data

(60) Provisional application No. 60/582,972, filed on Jun. 25, 2004.

(51) Int. Cl.
*H03B 1/04* (2006.01)
*H03B 5/12* (2006.01)
*H03C 3/22* (2006.01)

(52) U.S. Cl. ............... 331/105; 331/36 C; 331/117 FE; 331/177 V

(58) Field of Classification Search ............. 331/36 C, 331/117 FE, 177 V
See application file for complete search history.

(56) References Cited

U.S. PATENT DOCUMENTS

| 5,694,092 | A | 12/1997 | Oba et al. |
| 6,545,555 | B1 * | 4/2003 | Justice et al. ............ 331/117 R |
| 6,803,829 | B2 | 10/2004 | Duncan et al. |
| 6,853,262 | B2 | 2/2005 | Feilkas et al. |
| 7,116,183 | B2 * | 10/2006 | Wu ........................ 331/117 R |

OTHER PUBLICATIONS

U.S. Appl. No. 11/085,404, filed Mar. 21, 2005, entitled Push Compensation in an Oscillator, by Ligang Zhang.

* cited by examiner

*Primary Examiner*—Robert Pascal
*Assistant Examiner*—James Goodley
(74) *Attorney, Agent, or Firm*—Zagorin O'Brien Graham LLP

(57) ABSTRACT

A variable capacitance circuit includes a first and a second capacitor. A switch having an associated first nonlinear capacitance, selectively couples the first and second capacitors. To compensate for the first nonlinear capacitance, a second nonlinear capacitance is coupled to the switch that has a capacitance value responsive to a change in voltage that moves in a direction of change opposite to a direction of change of the first nonlinear capacitance.

21 Claims, 4 Drawing Sheets

METHOD AND APPARATUS FOR NOISE COMPENSATION IN AN OSCILLATOR CIRCUIT

BACKGROUND

1. Field of the Invention

This application relates to oscillator circuits and more particularly to suppression of noise in oscillator circuits.

2. Description of the Related Art

A voltage controlled oscillator (VCO) may be implemented using LC tank circuits. The oscillating frequency of the VCO is proportional to $\sqrt{1/LC}$. Thus, it is common to use variable capacitance circuits to vary the capacitance (C) and thus the output frequency of the VCO. Voltage controlled oscillators are commonly found in such applications as phase-locked loop circuits. FIG. 1 illustrates a high level block diagram of a phase-locked loop 100. In the phase-locked loop 100 an input signal 101 and a feedback signal 103 are coupled to a phase/frequency detector 105 that determines the phase/frequency difference between the input signal 101 and the feedback signal 103. That difference is supplied to a loop filter 104, which supplies a control voltage on node 118 to vary the output of the VCO 110 in accordance with the control voltage.

An exemplary VCO circuit is shown in FIG. 2. The exemplary VCO circuit shown in FIG. 2 is an LC tank circuit and includes an inductor 122, a variable capacitance circuit 124, and a gain circuit 126. The output of the VCO can be varied by varying the capacitance circuit 124 in accordance with the control voltage supplied on node 118 (FIG. 1). One variable capacitance circuit utilized in a VCO is described in U.S. Pat. No. 6,147,567, issued Nov. 14, 2000, naming Welland et al, as inventors, which is incorporated herein by reference.

The variable capacitance circuit 124 can have nonlinear capacitances associated both with elements that are used to vary the capacitance and the amplifier circuits. The nonlinear capacitance varies with the voltage seen by the nonlinear capacitor. The nonlinear capacitance can cause the instantaneous output frequency of the VCO to vary as a function of VCO amplitude, which can result in undesirable jitter or noise associated with the output of the VCO. It would be desirable to provide a way to compensate for nonlinear capacitance found in variable capacitor structures to improve oscillator performance.

SUMMARY

In one embodiment of the invention, a method is provided for compensating for noise in a controllable oscillator. The method includes providing a first and a second capacitor respectively coupled to first and second tank circuit nodes. A switch couples the first and second capacitors, the switch having an associated first nonlinear capacitance having a capacitance value that varies with voltage. Compensation for the first nonlinear capacitance is achieved with a second nonlinear capacitance coupled to the switch whose change in capacitance value in response to a change in voltage moves in a direction opposite the change in capacitance value of the first nonlinear capacitance in response to the change in voltage.

In another embodiment the invention provides an apparatus that includes a variable capacitance circuit that includes a first and a second capacitor. A switch having an associated first nonlinear capacitance, selectively couples the first and second capacitors. A second nonlinear capacitance is coupled to the switch that has a capacitance value responsive to a change in voltage that moves in a direction of change opposite to a direction of change of the first nonlinear capacitance in response to the change in voltage.

BRIEF DESCRIPTION OF THE DRAWINGS

The present invention may be better understood, and its numerous objects, features, and advantages made apparent to those skilled in the art by referencing the accompanying drawings.

FIG. 4 illustrates the variable capacitor circuit when the switch is turned ON.

The use of the same reference symbols in different drawings indicates similar or identical items.

DESCRIPTION OF THE PREFERRED EMBODIMENT(S)

Figure 1:
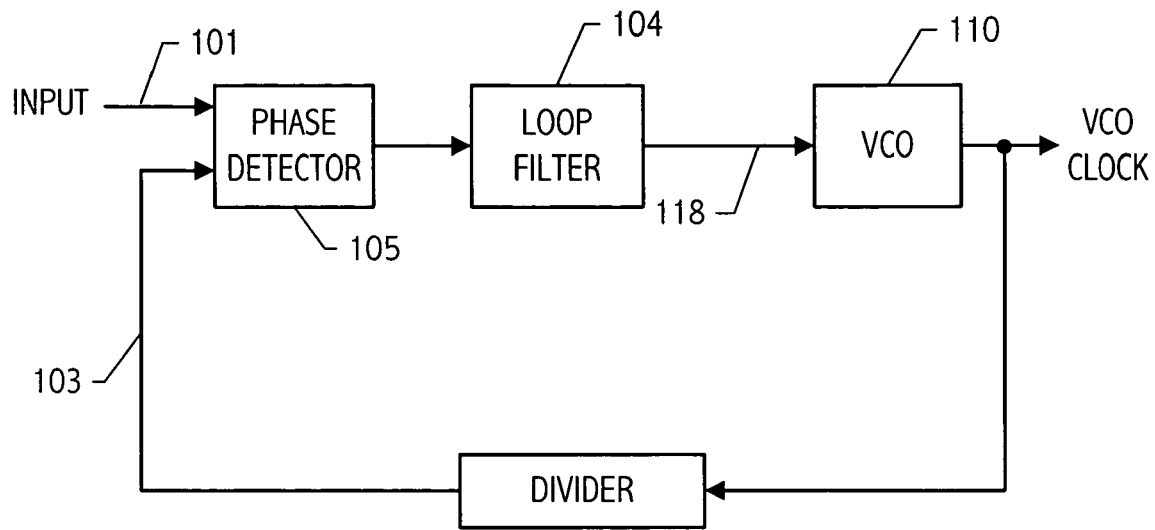
FIG. 1 illustrates a basic diagram of a phase-locked loop circuit.
Figure 2:
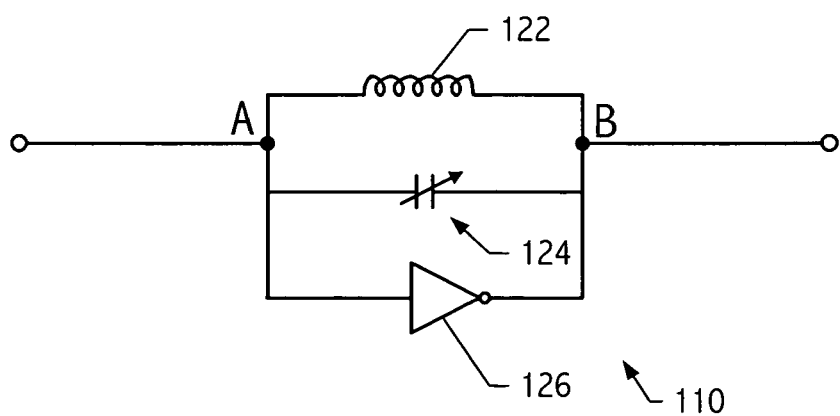
FIG. 2 illustrates a high level diagram of an exemplary voltage controlled oscillator (VCO).
Figure 3:
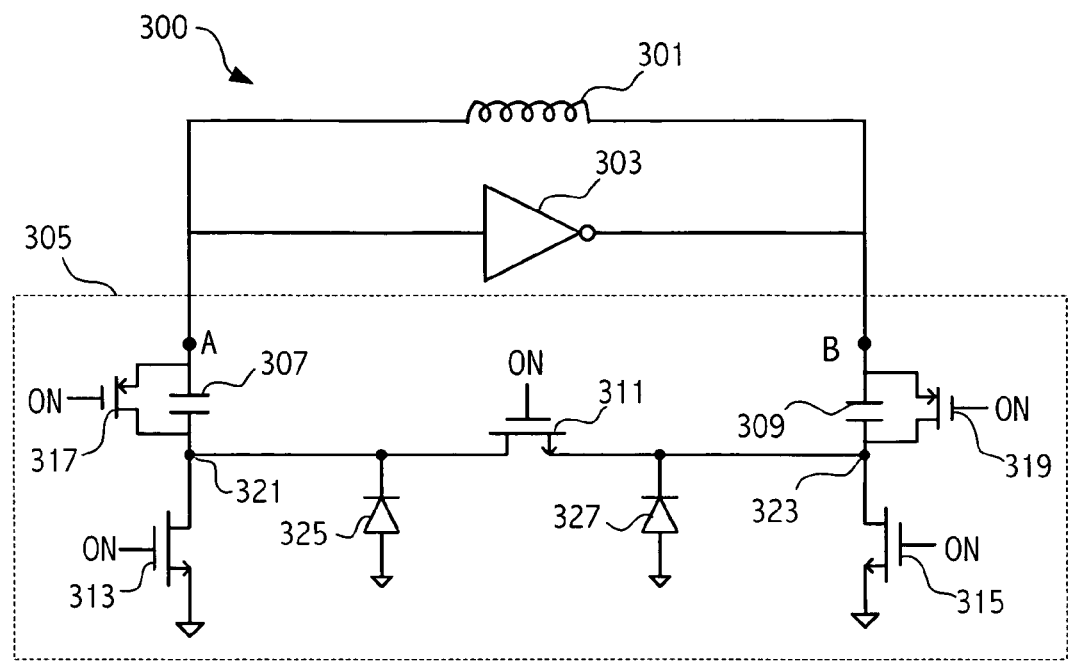
FIG. 3 illustrates a voltage controlled oscillator circuit including a portion of a variable capacitor circuit.
Figure 4:

Referring to FIG. 3 a portion of a VCO 300 is illustrated that includes an inductor 301, a gain circuit 303 and a portion 305 of a variable capacitance circuit. The portion 305 of the variable capacitance circuit includes a capacitor 307 and a capacitor 309 that are selectably coupled by a low resistance switch 311. In one embodiment, the switch 311 is implemented as an N-channel MOS transistor. When the switch 311 is turned on by a control voltage ON, the capacitors appear as serially coupled capacitors between tank circuits node A and B as illustrated in FIG. 4. In addition, transistors 313 and 315 are turned on when switch 311 is turned on. Transistors 313 and 315 are small transistors weakly coupling the capacitor to ground through a relatively high resistance path.

When the switch is OFF (ON=0), p-channel transistors 317 and 319 are turned on to provide, respectively, a relatively high resistance path between node A and node 321 and node B and node 323. That ensures that the DC bias at nodes 321 and node 323 tracks the DC voltage at nodes A and B, respectively, when the switch 311 is off, rather than having those nodes floating.

Figure 5:
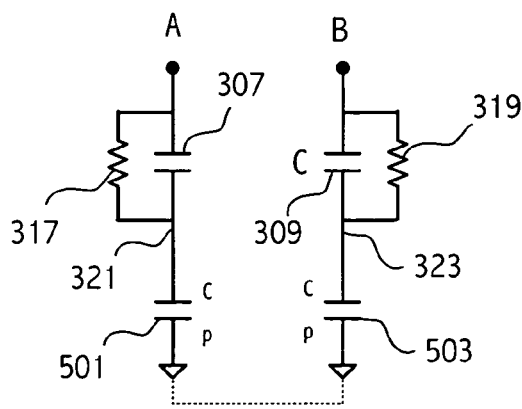
FIG. 5 illustrates the variable capacitor circuit when the switch is turned OFF.

FIG. 5 illustrates the circuit when the switch 311 is OFF. FIG. 5 illustrates the parasitic nonlinear capacitance as capacitors 501 and 503. Note that FIG. 3 represents the parasitic capacitance associated with the switch 311, by the diodes 325 and 327 indicative of the junctions respectively formed between the source and substrate and the drain and the substrate that results in the parasitic capacitance. That parasitic capacitance 501 and 503 is nonlinear and has a capacitance value that varies respectively with the voltage seen on nodes 321 and 323. Thus, as the voltage across nodes A and B vary, the value of the capacitance varies resulting in capacitance value of the C portion of an LC tank circuit varying. The voltage signals on node 321 and 323 have two components. One component is the desired sinusoidal oscillation signal present on the tank circuit nodes A and B. The other component is voltage noise caused by VCO amplifiers and other elements associated with the LC tank. When there is nonlinear capacitance associated with the tank, such voltage noise, though mostly at a lower frequency, can modulate the VCO oscillation frequency and be upconverted and cause phase noise in the VCO. As shown in FIG. 5, the parasitic capacitance is of particular concern when switch 311 is OFF and the voltage on node 321 and 323 track the voltage on the tank nodes A and B, respectively. Since the voltage on the nodes of the tank circuit is varying, the nonlinear capacitance varies in response to that voltage.

Figure 6:
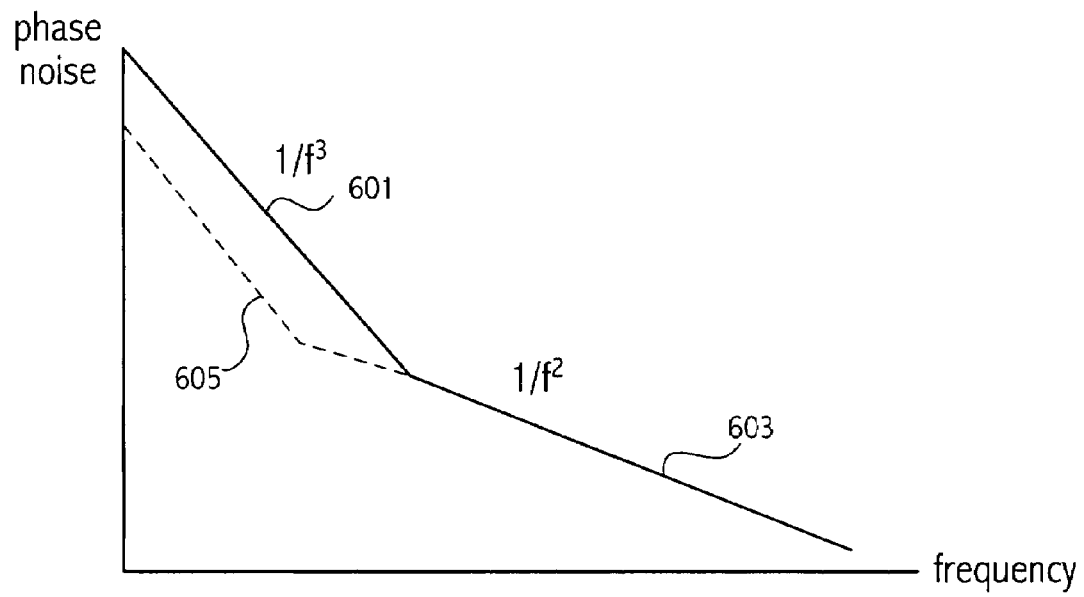
FIG. 6 illustrates a graph of phase noise versus frequency in an exemplary VCO.

That nonlinear capacitance may cause phase noise in the VCO output due to modulation by amplifier 1/f noise resulting in $1/f^3$ phase noise 601 shown in FIG. 6.

If it were possible to compensate for the nonlinear capacitance, the $1/f^3$ phase noise could be reduced as shown by 605.

Figure 7:
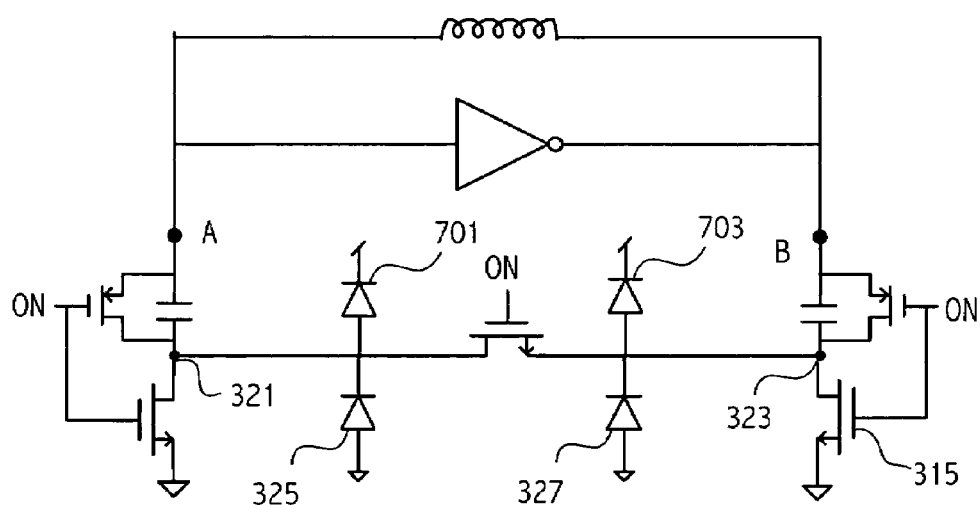
FIG. 7 illustrates an embodiment in which nonlinear capacitance is compensated by addition of additional nonlinear capacitance.

FIG. 7 shows an embodiment in which the capacitance associated with the n channel diodes 325 and 327 is compensated by the addition of p-channel diodes 701 and 703 coupled between nodes 321 and 323, respectively and a reference voltage. The nonlinear capacitance associated with the diodes 701 and 703 moves in a direction opposite that of the nonlinear capacitance associated with the N-channel diodes 323 and 325. Thus as the voltage on node 321 moves higher, the capacitance associated with the p-channel device 701 will go higher while the capacitance associated with the n-channel device 325 will move down. Similarly, as the voltage moves in one direction on node 323 the capacitances associated with n-channel device 327 and p-channel device 703 move in opposite directions. In that way, the total capacitance of the two nonlinear capacitances generates an overall more linear capacitance with variations in oscillator voltages at nodes within the VCO seen by the nonlinear capacitances.

Figure 8:
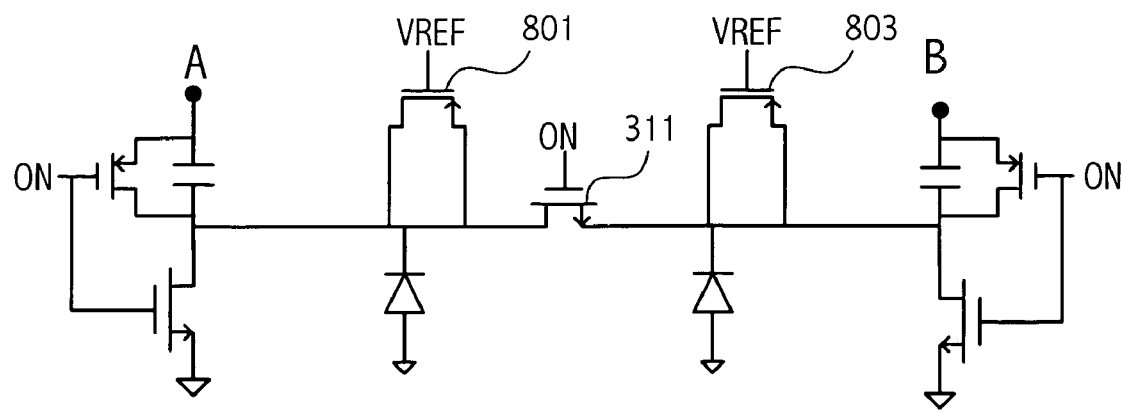
FIG. 8 illustrates an embodiment of a circuit compensating for nonlinear capacitance.

Referring to FIG. 8, in one embodiment of the invention, the nonlinear P-channel devices are implemented as P-channel transistors 801 and 803. In order to compensate for the capacitance associated with the N-channel device, switch 311, the source and drain area (W×L) of transistors 701 and 703 is sized to be one half the corresponding area of the N-channel transistor 311. Simulation of the effects of the compensation circuit described herein using transistors 801 and 803 shows $1/f^3$ phase noise improves by 6 dB.

Figure 9:
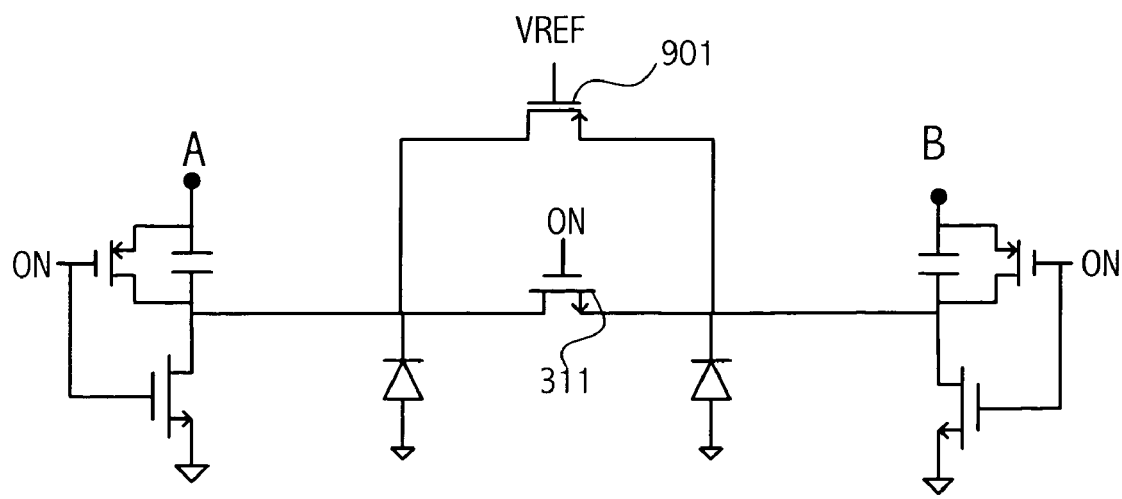
FIG. 9 illustrates another embodiment of a circuit compensating for nonlinear capacitance.

Referring to FIG. 9, in another embodiment of the invention, capacitance associated with a nonlinear P-channel device 901 is utilized to compensate for the N-channel device, switch 311. In order to compensate for the capacitance associated with the N-channel device, switch 311, the source and drain area (W×L) of transistor 901 is sized to be equal to the corresponding area of the N-channel transistor 311.

Thus, various embodiments have been described. The description of the invention set forth herein is illustrative, and is not intended to limit the scope of the invention as set forth in the following claims. Other variations and modifications of the embodiments disclosed herein, may be made based on the description set forth herein, without departing from the scope and spirit of the invention as set forth in the following claims.

What is claimed is:

1. A method compensating for noise in a controllable oscillator, comprising:
   providing a first and a second capacitor respectively coupled to first and second tank circuit nodes;
   providing a switch between and selectively coupling the first and second capacitors according to a value of a control signal supplied to the switch, the switch having an associated first nonlinear capacitance that varies with a voltage at a third node coupled to the switch; and
   compensating for the first nonlinear capacitance with a second nonlinear capacitance coupled to the switch, the second nonlinear capacitance responsive to a change in the voltage at the third node to move a capacitance value of the second nonlinear capacitance in a direction opposite a direction of change of the first nonlinear capacitance in response to the change in the voltage.

2. The method as recited in claim 1 further comprising selectably causing the first and second capacitors to appear in series between the first and second tank node circuits according to the control signal supplied to the switch.

3. The method as recited in claim 1 wherein the first switch is a transistor having a channel region of a first conductivity type and having a source region coupled to the first capacitor and a drain region coupled to the second capacitor.

4. The method as recited in claim 3 wherein the second non-linear capacitance is provided by capacitance associated with one or more devices having a channel region of a second conductivity type.

5. The method as recited in claim 4 wherein the first conductivity type is N and the second conductivity type is P.

6. The method as recited in claim 4 wherein the one or more devices are transistors.

7. The method as recited in claim 4 wherein the second nonlinear capacitance is provided by a first transistor having a source and drain coupled to the source of the first switch and a second transistor having a source and drain coupled to the drain of the first switch.

8. The method as recited in claim 7 wherein an area of the first and second transistors is approximately one half the size of a corresponding area of the transistor forming the switch.

9. An apparatus comprising:
   a variable capacitance circuit comprising:
   a first and a second capacitor;
   a switch having a first nonlinear capacitance associated therewith, the switch responsive to an applied voltage at a control terminal of the switch to selectively couple the first and second capacitors; and
   a second nonlinear capacitance coupled to the switch having a capacitance value that, responsive to a change in voltage at a node connecting the first and second nonlinear capacitances, moves in a direction of change opposite to a direction of change of the first nonlinear capacitance in response to the change in voltage.

10. The apparatus as recited in claim 9 wherein the first and second capacitors are coupled in series by the switch.

11. The apparatus as recited in claim 9 wherein the switch is an MOS transistor having a channel region of a first conductivity type and having a source coupled to the first capacitor and a drain coupled to the second capacitor.

12. The apparatus as recited in claim 11 wherein the second non-linear capacitance is provided by capacitance associated with one or more devices having a channel region of a second conductivity type.

13. The apparatus as recited in claim 12 wherein the first conductivity type is N and the second conductivity type is P.

14. The apparatus as recited in claim 12 wherein the one or more devices are MOS transistors.

15. The apparatus as recited in claim 12 wherein the second nonlinear capacitance is provided by a first P-channel transistor having a source and drain coupled to the source of the first switch and a second P-channel transistor having a source and drain coupled to the drain of the first switch.

16. The apparatus as recited in claim 15 wherein a transistor forming the switch is an N-channel transistor and the first and second P-channel transistors are sized to have source/drain regions approximately one half those of the N-channel transistor.

17. The apparatus as recited in claim 9 further comprising an LC tank circuit including the variable capacitance circuit.

18. The apparatus as recited in claim 9 further comprising a voltage controlled oscillator including the variable capacitance circuit.

19. An oscillator circuit comprising:
a variable capacitance circuit including a first and second capacitor coupled by a switch having a channel region of a first conductivity type and responsive to a first value of a control signal supplied to the switch to cause the first and second capacitors to be coupled between first and second nodes of the oscillator circuit and responsive to a second value of the control signal to cause the first and second capacitors to be decoupled; and
means for compensating for a first nonlinear capacitance associated with the switch, the means for compensating including a second non-linear capacitance formed by one or more devices having a channel region of a second conductivity type, the second non-linear capacitance also coupled to the switch.

20. A method for making an integrated circuit, comprising:
forming a first and a second capacitor respectively coupled to first and second tank circuit nodes;
forming a switch having a channel region of a first conductivity type between the first and second capacitors and to selectively couple the first and second capacitors, the switch having an associated first nonlinear capacitance that varies with voltage; and
forming a compensation circuit having a channel region of a second conductivity type coupled to the switch and having a second nonlinear capacitance whose change in capacitance value in response to a change in the voltage moves in a direction opposite the first nonlinear capacitance.

21. The method as recited in claim 20 wherein the switch is formed to couple the first and second capacitors according to a first value of a control signal supplied to the switch and to decouple the first and second capacitors according to a second value of the control signal supplied to the switch.

* * * * *

UNITED STATES PATENT AND TRADEMARK OFFICE
CERTIFICATE OF CORRECTION

PATENT NO. : 7,253,693 B2  
APPLICATION NO. : 11/004022  
DATED : August 7, 2007  
INVENTOR(S) : Ligang Zhang and Yunteng Huang It is certified that error appears in the above-identified patent and that said Letters Patent is hereby corrected as shown below:

Col. 3, line 42, please replace "transistor fonning" with -- transistor forming --

Signed and Sealed this

Sixth Day of November, 2007

JON W. DUDAS  
*Director of the United States Patent and Trademark Office*